United States Patent [19]

Potter

[11] 3,872,496

[45] Mar. 18, 1975

[54] HIGH FREQUENCY DIODE HAVING SIMULTANEOUSLY FORMED HIGH STRENGTH BONDS WITH RESPECT TO A DIAMOND HEAT SINK AND SAID DIODE

[75] Inventor: Curtis N. Potter, Holliston, Mass.

[73] Assignee: Sperry Rand Corporation, New York, N.Y.

[22] Filed: Sept. 13, 1973

[21] Appl. No.: 396,960

[52] U.S. Cl. ........................ 357/81, 357/56, 357/79, 29/589

[51] Int. Cl. ............................ H01l 3/00, H01l 5/00

[58] Field of Search ............... 317/234, 1, 4, 6, 235, 317/47.1; 29/589

[56] References Cited

UNITED STATES PATENTS

| | | | |
|---|---|---|---|
| 3,457,471 | 7/1969 | Moroney et al. | 317/235 AK |
| 3,483,096 | 12/1969 | Gri et al. | 317/235 AK |
| 3,678,995 | 7/1972 | Collard | 317/234 A |
| 3,702,975 | 11/1972 | Miller | 317/234 A |
| 3,761,783 | 9/1973 | Kroger et al. | 317/234 A |

OTHER PUBLICATIONS

Diamond as an Insulating Heat Sink for a Series Combination of IMPATT Diodes; Proceedings of the IEEE, Apr. 1968; pp. 762–763.

*Primary Examiner*—Andrew J. James
*Attorney, Agent, or Firm*—Howard P. Terry

[57] ABSTRACT

High frequency diodes are manufactured by methods forming an efficient heat path from the active diode junction through a diamond heat conducting member to a heat sink. A planar preformed element which becomes a permanent part of the diode structure is used to transfer the forces which form the bond between the diamond heat conducting member and the heat sink; simultaneously, the preformed element is bonded to an opposite side of the diamond, becoming a permanent part of the high frequency circuit of the diode.

5 Claims, 2 Drawing Figures

HIGH FREQUENCY DIODE HAVING SIMULTANEOUSLY FORMED HIGH STRENGTH BONDS WITH RESPECT TO A DIAMOND HEAT SINK AND SAID DIODE

BACKGROUND OF THE INVENTION

1. Field of the Invention

The invention pertains to high power, high frequency or microwave diodes of the general type employed in transmission line amplifiers and oscillators and to methods of manufacture of such diodes. The invention more particularly relates to microwave diodes which operate at high power, continuous wave or pulsed levels and which therefore require effective arrangements for removal of heat generated at their active junctions.

2. Description of the Prior Art

Generally, prior art high frequency diodes expected to permit relatively high power operation in microwave amplifiers or oscillators, such as high efficiency mode devices, have suffered from various difficulties. Some of these are imposed by the nature of the high efficiency mode circuit devices themselves. These latter problems have been discussed in the generally available literature and in the M. I. Grace U.S. Pat. No. 3,646,581 for a "Semiconductor Diode High Frequency Signal Generator," in the M. I. Grace U.S. Pat. No. 3,646,357 for a "Semiconductor Diode High Frequency Signal Generator," in the M. I. Grace, H. Kroger, and H. J. Pratt U.S. Pat. No. 3,714,605 for a "Broad Band High Efficiency Mode Energy Converter," and in other Sperry Rand Corporation patents and pending patent applications on similar devices.

A primary direct limitation found in prior art high frequency diodes has been connected with the need greatly to improve dissipation of heat from the active junctions of the diodes. While many successful attempts have been made in the past to fabricate circular and ring shaped diodes, lack of perfect forming of bonds to efficient heat sinks has generally hindered effective heat removal from the diodes and has not permitted their reliably repeatable operation. Other very successful approaches to the problem have involved the use of multiplicities of diodes along with energy combining networks, such as are described in the U.S. Pat. No. 3,605,034 to C. T. Rucker and J. W. Amoss for a "Microwave Negative Resistance Transducer" and in the U.S. Pat. No. 3,662,285 to C. T. Rucker for a "Microwave Transducer and Coupling Network", both patents being assigned to the Sperry Rand Corporation. While valuable solutions to the problem are thus afforded, the initial cost of such combining network systems may be relatively high.

SUMMARY OF THE INVENTION

The present invention relates to high power, high frequency or microwave diodes of the general type employed in high efficiency transmission line amplifiers and oscillators and to methods of manufacture of such diodes. Such novel microwave diodes operate at high continuous wave or pulsed power levels and therefore require highly effective arrangements for removal of heat generated at their active junctions. Such high frequency diodes are manufactured according to the present invention by methods forming efficient heat paths from the active diode junction through a diamond heat conducting member to a cooperating heat sink. A planar preformed element which becomes a permanent part of the diode structure is used to transfer the forces which form the bond between the diamond heat conducting member and the heat sink; simultaneously, the preformed element is bonded to an opposite side of the diamond, becoming a permanent part of the high frequency circuit of the diode.

DESCRIPTION OF THE PREFERRED EMBODIMENTS

Figure 1:
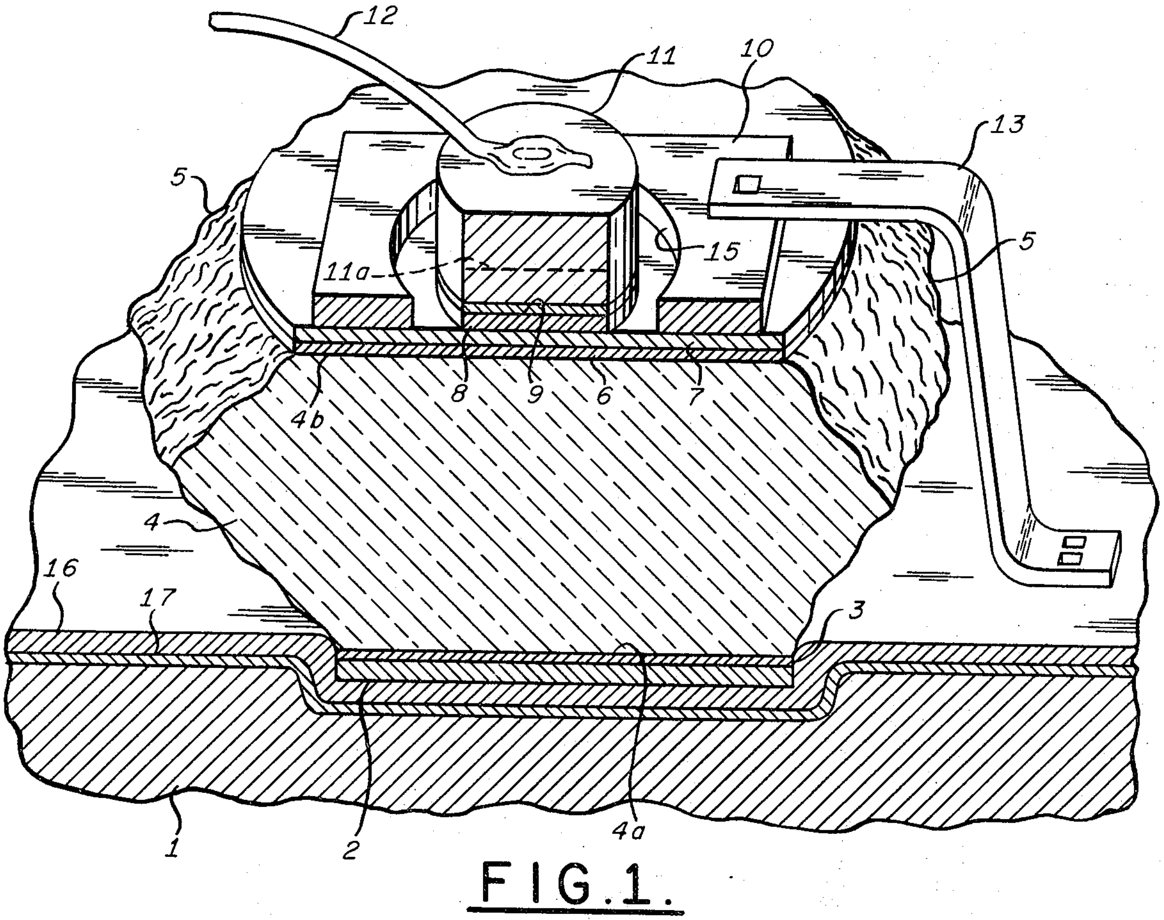
FIG. 1 is a perspective view showing an elevation cross section of the invention.

The novel microwave or high frequency diode structure is illustrated in FIG. 1 as being affixed to a relatively large heat sink 1, which heat sink may consist of a massive copper plate or a plate of some other metal having similarly good heat conducting properties. As is seen in FIG. 1, the principal elements of the frequency diode structure include the semiconductor diode 11 mounted upon a heat conducting element 5 having very low thermal impedance characteristics, the latter being bonded in turn to heat sink 1.

The semiconductor diode 11 may, for example, be a trapped plasma avalanche triggered transit diode, such as is generally known as the TRAPATT diode, and which finds application in high efficiency microwave or high frequency amplifiers or oscillators of the general type described in the M. I. Grace U.S. Pat. No. 3,605,004, issued Sept. 14, 1971 for a "High Efficiency Diode Signal Generator," and U.S. Pat. No. 3,646,581, issued Feb. 29, 1972 for a "Semiconductor Diode High-Frequency Signal Generaotr," both patents being assigned to the Sperry Rand Corporation. Such avalanche diodes generally dissipate several times as much power in the form of heat as is usefully converted into microwave power. However, high current densities must be obtained for high efficiency operation of the avalanche diode, but this may be reliably achieved only if heating of the diode junction is minimized. Efficient removal of heat from the diode junction allows the device to be operated at higher input power levels, which consequently allows higher power generation with improved conversion effeciency.

The need of providing a good heat sink for an avalanching transit time diode is satisfied according to the invention by use of a certain type of diamond found to have thermal conductivities about five times that of copper at room temperature (300° K.). While the thermal conductivity of such diamond material falls off inversely with increasing temperature, it is still twice as good as copper at elevated temperatures (500° K.). Type II*a* diamonds are found to exhibit the highest thermal conductivity of any available material.

The heat conducting element 4 is therefore preferably composed of such diamond material and has opposite sides **4*a* adn 4*b* which have been polished and are generally parallel, while other sides such as side 5 of the diamond, for reasons of economy, remiain roughly cut and irregular. The diamond heat conducting element 4 is prepared for use by application to its opposite polished sides of very thin layers 3 and 6 of chromium having typically a thickness of about 300 Angstrom units. The respective chromium layers 3 and 6 are each coated, in turn, with a thin layer of gold to a depth of about 1,000 Angstrom units. The gold layer 2 is bonded to heat sink 1, while the gold layer 7 is used to form a bond with the diode 11**, as will be described.

The diamond material is prepared for receiving the chromium and gold layers by mechanically polishing the two opposed surfaces 4*a* and 4*b*, which surfaces are then prepared for the chromium deposition, for example, by washing in hot sulfuric or chromic acid, followed by a succession of rinses with pure water and final drying. THe chromium layers 3 and 6 are then applied by evaporation to the required depth. The gold layers 2 and 7 may be formed next also by evaporation, and are made about 1,000 Angstrom units thick, being firmly bonded respectively to chromium layers 3 and 6. It is found desirable that the chromium layers 3 and 6 have excellent adhesion to the diamond in order subsequently to form a good thermal compression bond; however, it is found that the use of the chromium and gold layers on diamond with the novel thermal compression bonding procedure yet to be described improves the strength of the chromium-diamond bond. When the bonding pressure has been applied, it is found that the adhesion of the evaporated chromium films 3 and 6 to the diamond is thereby increased considerably. The method of coating the diamond and thermal compression bonding has produced mechanically strong bonds where breaking forces are realized as high as 20,000 pounds per square inch for gold-to-gold bonds. It will be recognized by those skilled in the art that conventional vacuum sputtering or evaporation methods may be used to deposit layers 2, 3, 6, and 7.

Heat sink 1 is prepared for thermal compression bonding by the application of a similar thin layer 17 of chromium, followed by the application of a gold layer 16. in this discussion, the term thermal compression bonding is taken to mean a process for fabricating a robust permanent bond between two metal surfaces, simultaneously using heat and pressure without melting either metal surface. The bond which results is formed by solid state diffusion, for example, of atoms from gold layer 2 into the gold surface 16 of copper plate 1 and vice versa under very high pressure and at a moderately elevated temperature, as will be further described. Suitable bonds may be also made between gold or silver layers or one layer may be silver and the other gold. Metals are preferred that have high electrical and thermal conductivity.

Figure 2:
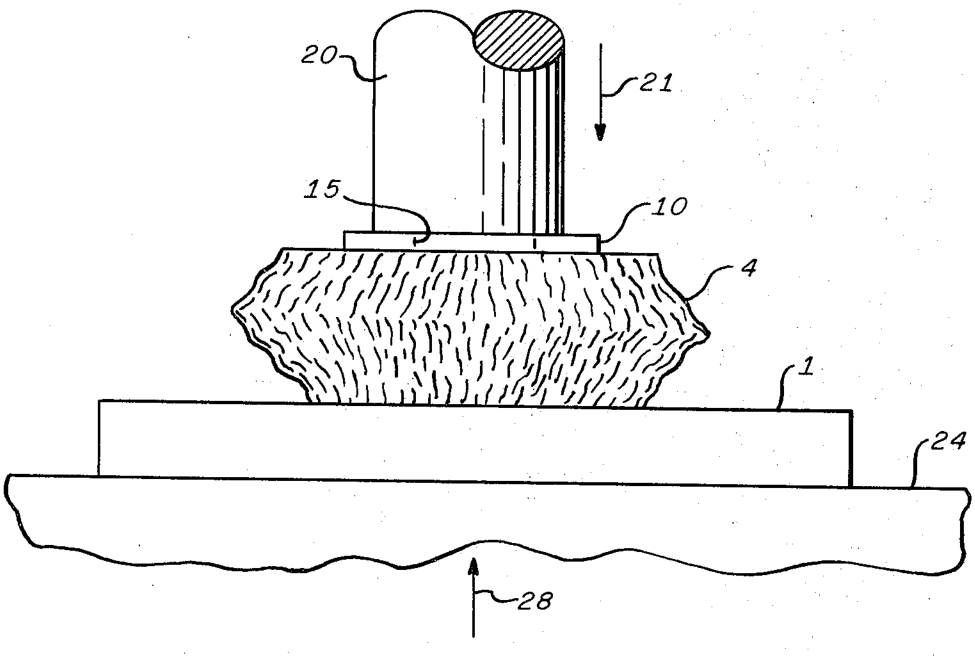
FIG. 2 is an elevation view illustrating the method of bonding of parts of the invention.

To facilitate thermal compression bonding of gold layer 2 to the gold surface of heat sink 1, a preformed planar structure 10 having a generally centrally located aperture 15 and made by a conventional photolithographic method is bonded directly to gold layer 7. The bond between gold layer 2 and gold layer 16 on the copper heat sink 1 and that between gold layer 7 and the preformed structure 10 are made simultaneously, as illustrated in FIG. 2. The procedure is to place the diamond heat conducting element 4 with its bonding layers 2 and 3 on the surface of gold layer 16 of the copper heat sink 1. Next, the preformed element 10 is positioned on the gold layer 7 so that the aperture 15 exposes the region to which diode 11 is to be affixed. A flat bonding tip 20 is lowered into intimate contact with the preformed structure 10 and, using a conventional mechanical or other press, a pressure of the order of 20,000 pounds per square inch is brought to bear upon the upper surface of the preformed element 10. During this action, the assembly is maintained at an elevated temperature, typically about 250° to 350° Centigrade. The simultaneous pressure and heating generates very strong bonds simultaneously between the preformed element 10 and gold layer 7 and between the opposite gold layer 2 and gold layer 16 of the copper heat sink 1. The pressure will generally be sufficient to cause diamond 4 and metal layers 2, 3 to indent the surface of heat sink 1, as generally shown in FIG. 1.

Details of the mechanical press used in the bonding step need not be supplied here, since commercially available hydraulic or other presses, equipped with standard force gauging or control instruments, are adequate for the purpose. When the thermal compression bonding process is carried out according to the novel method, bonding pressures as represented by arrow 21 as high as 20,000 pounds per square inch may be applied successfully without any fear of damaging the semiconductor diode 11 or the surface to which it is to be affixed. Highly reliable and uniform thermal comprssion bonds with minimum risk to both device and quality of the bond can then be accomplished at relatively low pressures. The desired gold layer thermal bonding temperature (275° to 350° Centigrade) is supplied by placing the diode device within a conventional heater of the type known in the art as a heat column, so that heat flows into heat sink 1 and diamond 4 in the sense of arrow 28 and thus to the junctions to be bonded. Automatically controlled heaters may be employed which convenitonally control the temperature at the desired junctions so that they lie in the range from 300° to 320° Centigrade, for example, thus ensuring that high quality bonds are regularly formed.

The structure is further completed, after the preformed element 10 is bonded in place, by attaching the semiconductor diode 11 to the gold layer 7. As seen in the FIG. 1, diode 11 is supplied with a thin chromium layer 9 and an extenral gold layer 8. The respective gold and chromium layers 8 and 9 have been formed on the side of the diode 11 closest to the active diode junction 11*a*. Beneficially, the junction 11*a* is placed as close as possible to the diamond heat conducting element 4, so that the flow of heat generated in junction 11a into the diamond element 4 and out of the latter into heat sink 1 is enhanced.

For this purpose, a polished surface of diode 11 is supplied with a layer 9 of chromium about 300 Angstrom units thick and a layer 8 of gold about 1,000 Angstrom units thick. To install diode 11, it is placed in position and a conventional method such as a thermal compression bonding method is used to bond the gold layers 7 and 8. Non-conventional methods of bonding diode 11 to the diamond heat conducting element 4 may also be used, especially in the instance of diode elements having irregular shapes. Particularly, if the active diode region is to be ring shaped, two ring-shaped bonds will be made between the aforementioned gold layers, and such may be accomplished by employing the methods described in the H. Kroger, C. N. Potter U.S. Pat. application Ser. No. 222,771, filed Feb. 2, 1972, issued as U.S. Pat. No. 3,761,783, Sept. 25, 1973 for a "High Frequency Diode and Method of Manufacture" and assigned to the Sperry Rand Corporation.

To complete the structure of the novel diode, a gold strap 13 is fastened by a conventional thermal compression or other bonding method to an exposed surface of the preformed element 10 and also to an exposed gold surface layer 16 of heat sink 1. The conductive strap 13 beneficially serves to carry microwave energy from the preformed element 10 to the normally electrically grounded heat sink 1. Use of the strap 13 in conjunction with the preformed structure 10 eliminates the prior art requirements for applying a thin layer of conductive metal to the irregularly shaped sides 5 of the diamond element 4. A bias lead 12 which also assists in coupling the high frequency electric power across diode 11 is finally affixed to a surface of diode 11 opposite the preformed element 10.

It is seen that, according to the invention, a highly efficient heat path is provided between the active semiconductor junction 11a and the heat sink 1. It will be understood that a very efficient path for heat flow from the heat sink 1 to external means for dissipating such heat, such as cooling fins or other fluid cooling elements, may be readily provided as indicated at 24 in FIG. 2. By such an arrangement, the temperature of heat sink 1 may be readily held near ambient temperature, as is desired. While maximizing the rate of flow fo heat away from the diode active junction, the novel configuration and method also minimizes microwave frequency losses.

Use of the preformed structure 10 allows thermal compression bonding of a desirable, very thin metallized diamond heat conductor 4 to a heat sink 1 without damage of any kind to the thin metal layers 6 and 7, especially in the area where the thinly metallized semiconductor diode 11 is to be bonded. Because the area where the semiconductor diode 11 is to be bonded is protected during the heat sink bonding step, it is possible to use much thinner than conventional layers 8, 9 of bonding metal between the semiconductor diode 11 and the diamond element 4, and thus to achieve lower than conventional values of series thermal resistance for these elements. There is a significant economy of fabrication steps according to the novel method in that the preformed structure 10 and the thermal sink 1 are bonded to the diamond element 4 simultaneously. The preformed structure 10, generally of the shape shown, may be fabricated by conventional photolithographic techniques so that it may be placed in very close proximity to the periphery of the semiconductor diode 11, thus minimizing the series electrical resistance at microwave frequencies between the semiconductor diode 11 and the preformed element 10 through the surface of the thin metal layer 7. The preformed element 10 itself serves as a low loss path to the signals of microwave frequencies, having a thickness several times that of the skin depth. The preformed element also serves as a bonding base for the strap 13 which carries microwave power from the preformed structure 10 to the heat sink 1. Additionally, use of the strap 13 in conjunction with preformed structure 10 eliminates the need of metallizing the irregularly shaped sides 5 of the diamond 4 with a metal layer of thickness greater than the skin-depth at the high frequencies involved.

While the invention has been described in its preferred embodiments, it is to be understood that the words which have been used are words of description rather than of limitation and that changes within the purview of the appended claims may be made without departure from the true scope and spirit of the invention in its broader aspects.

I claim:

1. In a high frequency semiconductor device, diamond heat conductor means having first and second opposed substantially parallel flat polished surfaces, first and second high electrical and thermal conductivity metal layers bonded separately to said respective first and second opposed substantially parallel flat polished surfaces, massive heat sink means bonded to said first metal layer, preformed apertured plate means bonded to said second metal layer simultaneously with the bonding of said massive heat sink means to said first metal layer, and active semiconductor means bonded substantially concentrically within said aperture to said second metal layer within said aperture.

2. Apparatus as described in claim 1, wherein said diamond heat conductor means comprises type II*a* diamond material.

3. Apparatus as described in claim 2 wherein said first and second high electrical and thermal conductivity metal layers each comprise;

a thin layer of chromium bonded to said diamond heat conductor means, and a thin layer of gold bonded to said thin layer of chromium.

4. Apparatus as described in claim 1 further comprising high frequency electrical conductor means bonded to said preformed apertured plate means and to said massive heat sink means.

5. Apparatus as described in claim 4 further comprising bias power electrical conductor means affixed to said semiconductor device opposite said second metal layer.

* * * * *